(12) United States Patent
Christison

(10) Patent No.: US 7,978,425 B2
(45) Date of Patent: Jul. 12, 2011

(54) ADJUSTABLE LENS MOUNTING ASSEMBLY

(75) Inventor: Eric Christison, Edinburgh (GB)

(73) Assignee: STMicroelectronics (Research & Development) Ltd, Buckinghamshire (GB)

( * ) Notice: Subject to any disclaimer, the term of this patent is extended or adjusted under 35 U.S.C. 154(b) by 38 days.

(21) Appl. No.: 12/191,969

(22) Filed: Aug. 14, 2008

(65) Prior Publication Data

US 2009/0109554 A1   Apr. 30, 2009

(30) Foreign Application Priority Data

Oct. 30, 2007   (EP) .................................... 07119674

(51) Int. Cl.
*G02B 7/02*   (2006.01)
(52) U.S. Cl. ........................................................ 359/823
(58) Field of Classification Search ................. 359/823
See application file for complete search history.

(56) References Cited

U.S. PATENT DOCUMENTS

| | | | |
|---|---|---|---|
| 2006/0103953 A1* | 5/2006 | Lee et al. | 359/819 |
| 2007/0058069 A1 | 3/2007 | Chen et al. | |
| 2008/0252775 A1* | 10/2008 | Ryu et al. | 348/374 |

FOREIGN PATENT DOCUMENTS

| | | |
|---|---|---|
| DE | 10 2006 049 008 A1 | 4/2007 |
| EP | 1 686 790 A1 | 8/2006 |

OTHER PUBLICATIONS

European Search Report; EP 07 11 9674; Feb. 22, 2008; 5 Pages.

* cited by examiner

*Primary Examiner* — Ricky L Mack
*Assistant Examiner* — James C Jones
(74) *Attorney, Agent, or Firm* — Andre M. Szuwalski; Gardere Wynne & Sewell LLP

(57) ABSTRACT

A lens barrel is mated with a lens mount through use of a screw thread whereby relative rotation adjusts lens focus. The lens barrel and lens mount are additionally provided with an interengaging formation that is interposed between an optical axis of the lens barrel and the screw thread. This formation provides a cylindrical sliding contact which isolates any particles produced by operation of the screw thread from reaching the optical components at or near the optical axis.

13 Claims, 4 Drawing Sheets

US 7,978,425 B2

ADJUSTABLE LENS MOUNTING ASSEMBLY

PRIORITY CLAIM

The present application claims priority from European Application for Patent No. 07119674.5 of the same title filed Oct. 30, 2007, the disclosure of which is hereby incorporated by reference.

BACKGROUND

1. Technical Field of the Invention

The present invention relates to a mounting arrangement for a lens which permits adjustment during assembly of a camera. The invention is particularly, but not exclusively, applicable to the manufacture of small, inexpensive solid state cameras for use in products such as camera phones.

2. Description of Related Art

It is known to provide an image sensor or camera assembly comprising a solid state single chip image sensor and a lens, in which the lens can be adjusted in position during manufacture to achieve optimal focus of the image on the image sensor surface. Typically, the lens is mounted in a lens barrel which has a screw-threaded engagement with a lens mount, and an apparatus adjusts the focus by relative rotation until an optimal focus of a test image is achieved, as judged by an evaluation circuit. The lens barrel may then be locked relative to the chip holder, for example by bonding.

It has been found that after such adjustment a proportion of sensors suffer from unacceptable image quality because of artifacts in the output image. We have established that one cause of this arises from small particles being dislodged from the surfaces of the screw-threaded engagement and lodging on the image sensor surface, or on an optical element (for example, an infrared IR filter) overlying the image sensor surface. Any sensors or cameras suffering from this problem have to be discarded, with consequent increase in the average cost of acceptable sensors.

There is a need in the art to address this problem.

SUMMARY

In an embodiment, a mounting assembly for positioning a lens or lens assembly relative to an image sensor chip comprises: a lens barrel adapted to hold a lens or lens assembly; a lens mount adapted to receive an image sensor chip; the lens barrel and the lens mount being provided with mating screw threads by which the lens or lens assembly may be moved along an optical axis to adjust focus on the image sensor chip; and in which the lens barrel and lens mount are additionally provided with cooperating surfaces which engage in a sliding fit in a cylindrical surface around the optical axis, said cooperating surfaces being disposed between the optical axis and the screw threads.

This arrangement isolates debris from the screw threads from reaching the optical components.

Said cooperating surfaces are preferably formed on a rib formed on one of the chip mount and the lens barrel and engaging in a groove formed in the other of the lens mount and the lens barrel.

Preferably, the rib is an annular, axially extending rib on the lens mount, and the groove is an annular, axially extending slot in the lens barrel, and more preferably a radially outer cylindrical surface of the rib is a close sliding fit upon a radially outer cylindrical surface of the groove, and a clearance fit is defined between radially inner surfaces of the rib and slot.

An embodiment provides a camera comprising the mounting assembly defined above. The camera may particularly be incorporated in a mobile phone.

Another embodiment provides an optical mouse comprising the mounting defined above.

In an embodiment, a lens mounting assembly comprises: a lens barrel having outer radially extending circumferential threads and an axially extending circumferential groove; a mount having an opening for receiving the lens barrel, the opening having inner radially extending circumferential threads and an axially extending circumferential rib; wherein the axially extending circumferential groove in the lens barrel is sized and shaped to receive the axially extending circumferential rib from the mount.

In an embodiment, a lens mounting assembly comprises: a lens barrel having outer radially extending circumferential threads and an axially extending cylindrical rib; a mount having an opening for receiving the lens barrel, the opening having inner radially extending circumferential threads and an inwardly radially extending circumferential rib; wherein the inwardly radially extending circumferential rib of the mount defines a surface which abuts against an outer surface of the axially extending cylindrical rib.

BRIEF DESCRIPTION OF THE DRAWINGS

Embodiments of the present invention will now be described, by way of example only, with reference to the accompanying drawings, in which.

DETAILED DESCRIPTION OF THE DRAWINGS

Figure 3:
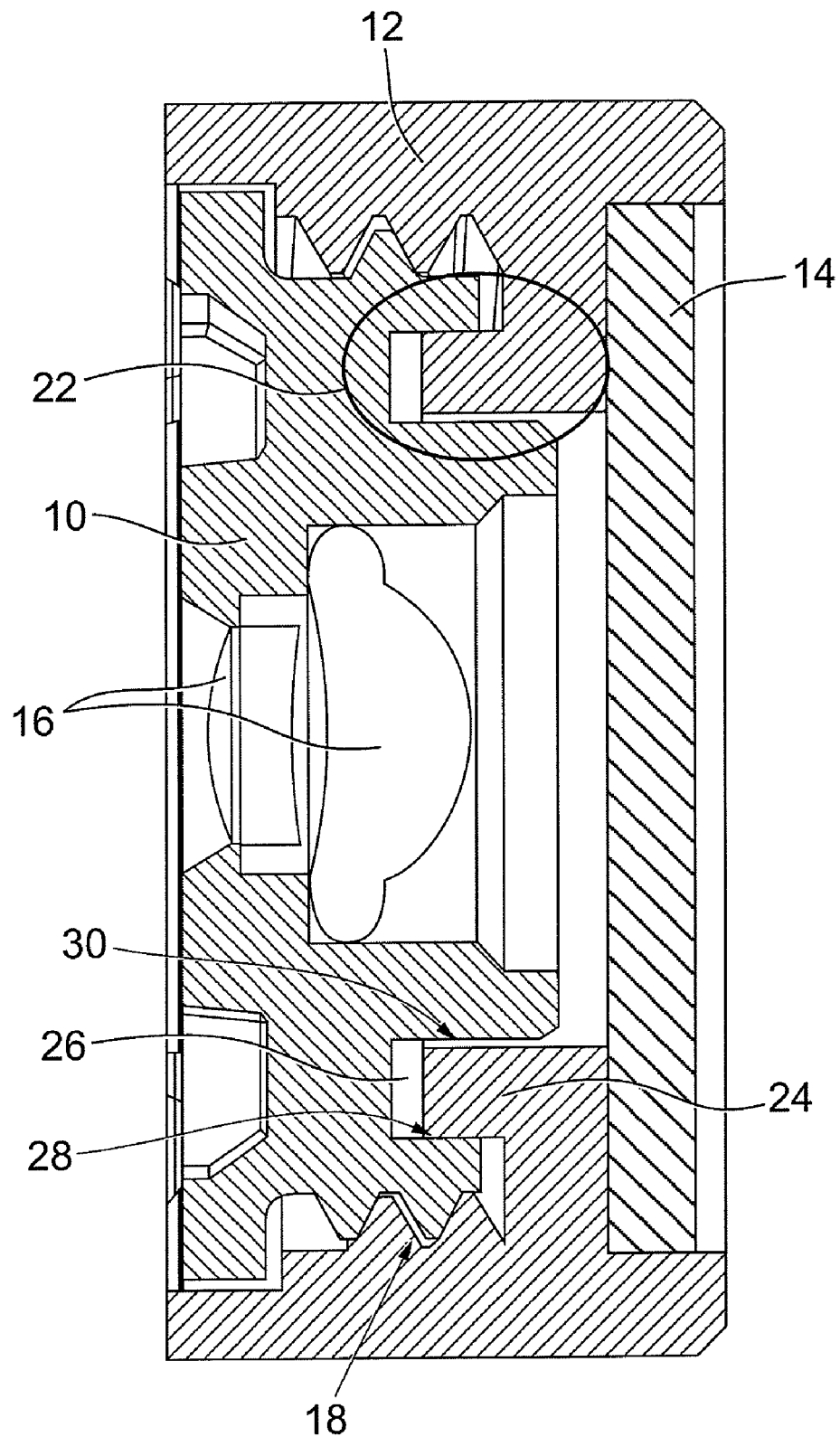
FIG. 3 is a cross-sectional side view of the same assembly.

Referring to the drawings, the assembly comprises a lens barrel 10 and an image sensor lens mount 12, each of which is typically a one-piece plastic molding. The lens barrel 10 holds a lens or lens assembly, and the lens mount 12 holds an image sensor chip 14. FIG. 3 indicates a two element lens assembly 16 and an image sensor chip 14; as the precise form of these is not relevant to the principles of the assembly, they are shown in outline only. Other optical elements such as filters and apertures may be mounted between the lens assembly 16 and the image sensor chip 14.

The lens barrel 10 and lens mount 12 are provided with mating screw threads 18a, 18b such that rotation of the lens barrel within the lens mount produces relative axial movement which can be used to focus the lens image on the light sensitive surface of the chip 14.

Figure 1:
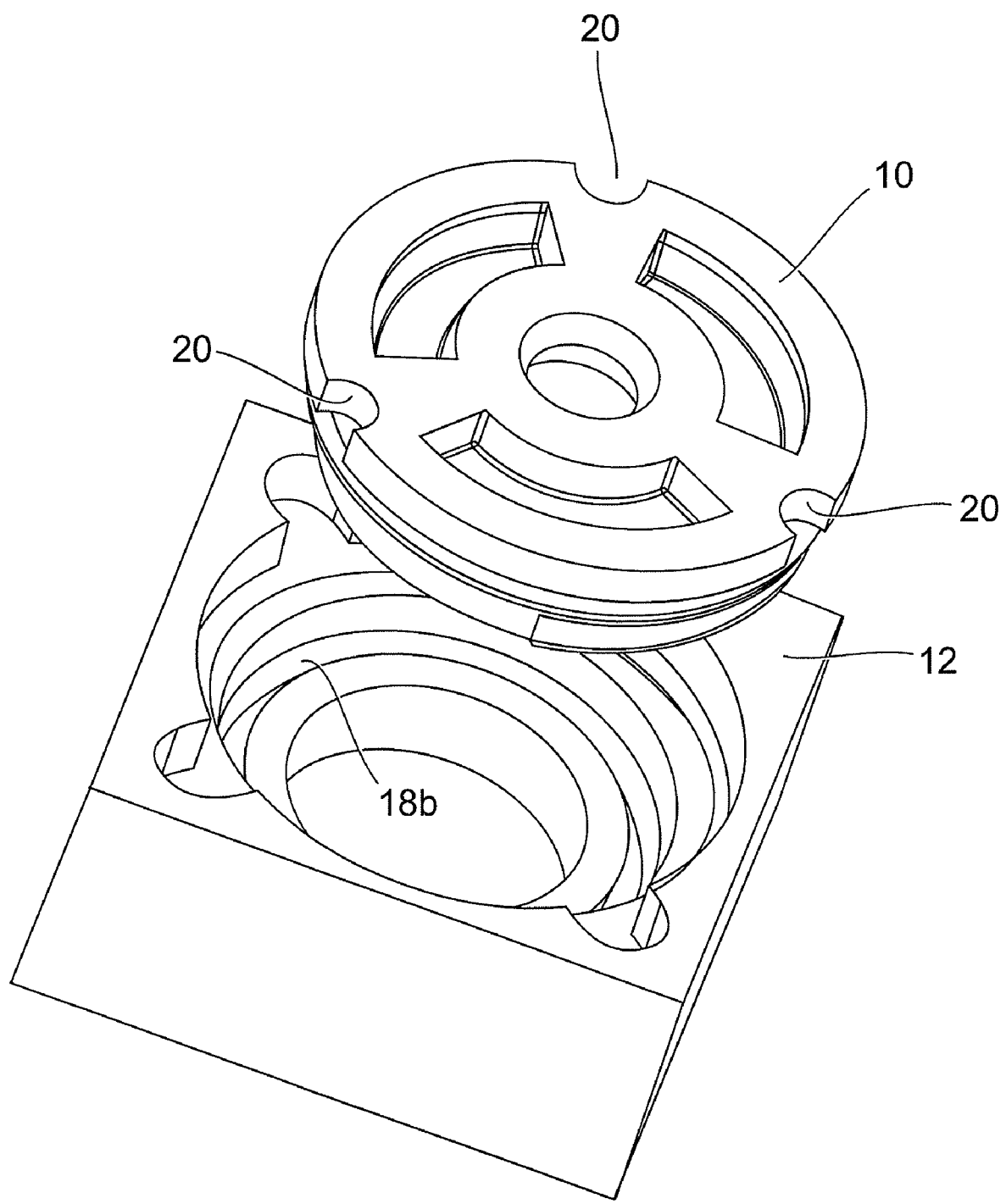
FIG. 1 is a top perspective view of a lens mounting assembly forming one embodiment.

As best seen in FIG. 1, the upper part of the lens barrel is provided at its periphery with three equi-spaced notches 20 for engagement by an automated focus-setting apparatus which is known per se. The focus is set by the apparatus assessing the quality of a test image, and rotating the lens barrel 10 until optimum image quality is found.

As discussed above, we have established that during such automated focus setting particles can be shed from the engaging screw thread surfaces and impinge on the image area, leading to quality rejection of a proportion of devices.

Referring particularly to FIG. 3, the screw threads 18 are radially separated from the lens assembly 16 by a formation generally designated at 22. The formation 22 comprises an axially extending rib 24 on the mount 12 which extends circumferentially around the optical axis. The rib 24 interfits with a circumferential groove 26 formed in the lens barrel 10. The parts are so dimensioned that the radially outer facing surfaces of the rib 24 and groove 26 are a close sliding fit as seen at 28, while the equivalent radially inner surfaces are a clearance fit as seen at 30.

Thus, if the relative rotation of the barrel 10 and mount 12 produces any debris from the screw threads 18, such debris will be contained in the annular volume outside of the rib 24 and cannot lodge in the optical path of the assembly.

The close fit at 28 has further advantages. It can be used to control the radial position of the lens, which can be done more accurately than by relying on the interfitting screw threads as radial location. The contact may also be made sufficiently firm as to provide resistance to relative rotation between the lens barrel 10 and the mount 12; this resistance may be used to ensure that the lens remains focused in use, rather than applying a separate locking operation such as bonding.

Modifications of the foregoing embodiment may be made within the scope of the invention.

For example, it would be possible to have the radially inner facing surfaces of the rib 24 and groove 26 as a close fit, with the outer surfaces a clearance fit.

Figure 2:
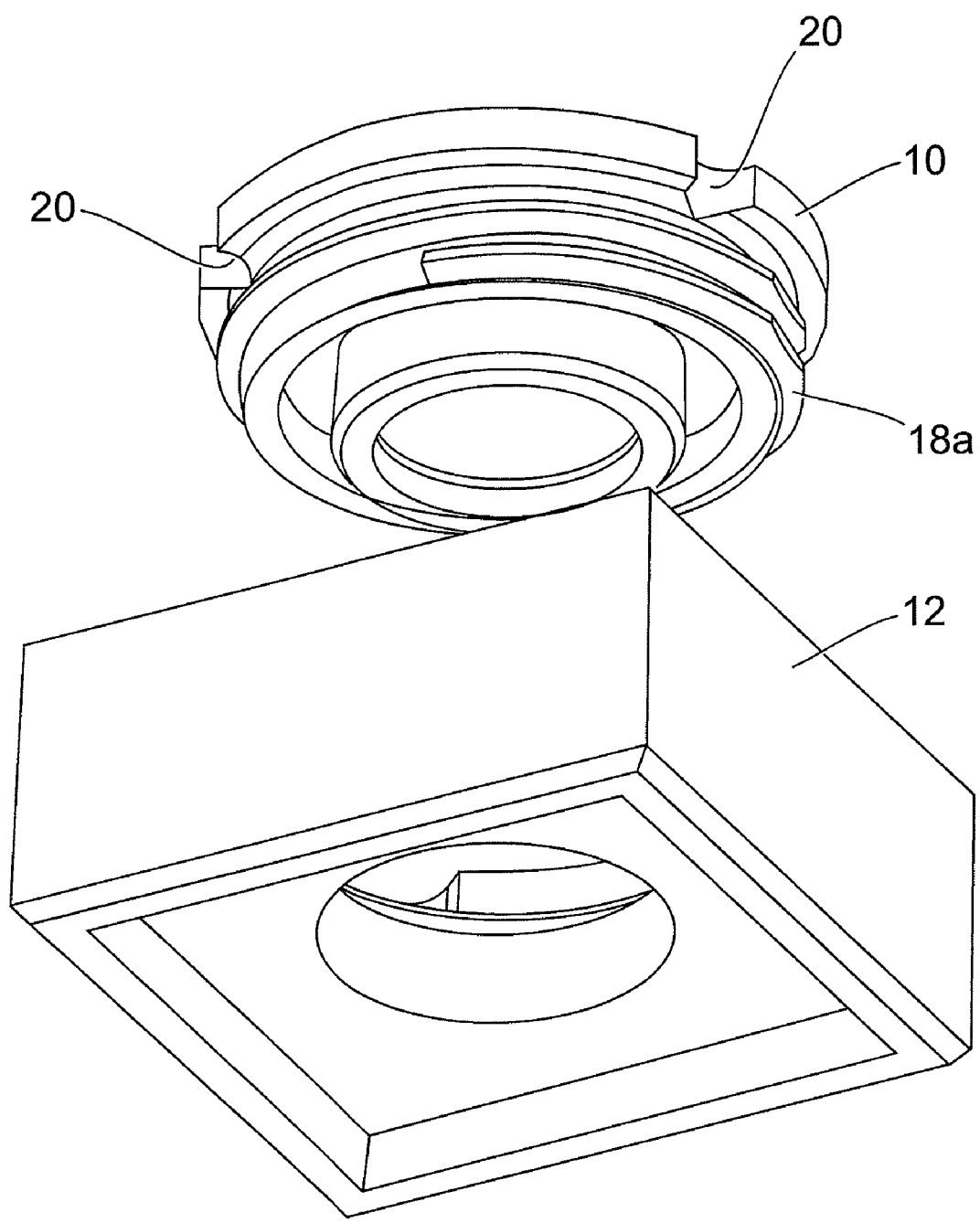
FIG. 2 is an underneath perspective view of the assembly of FIG. 1.

In principle, the arrangement of FIGS. 1 to 3 could also be reversed such that a rib on the lens barrel engages in a groove in the lens mount. In practice, however, this would involve increased overall size and additional material, and is therefore not preferred.

Figure 4:
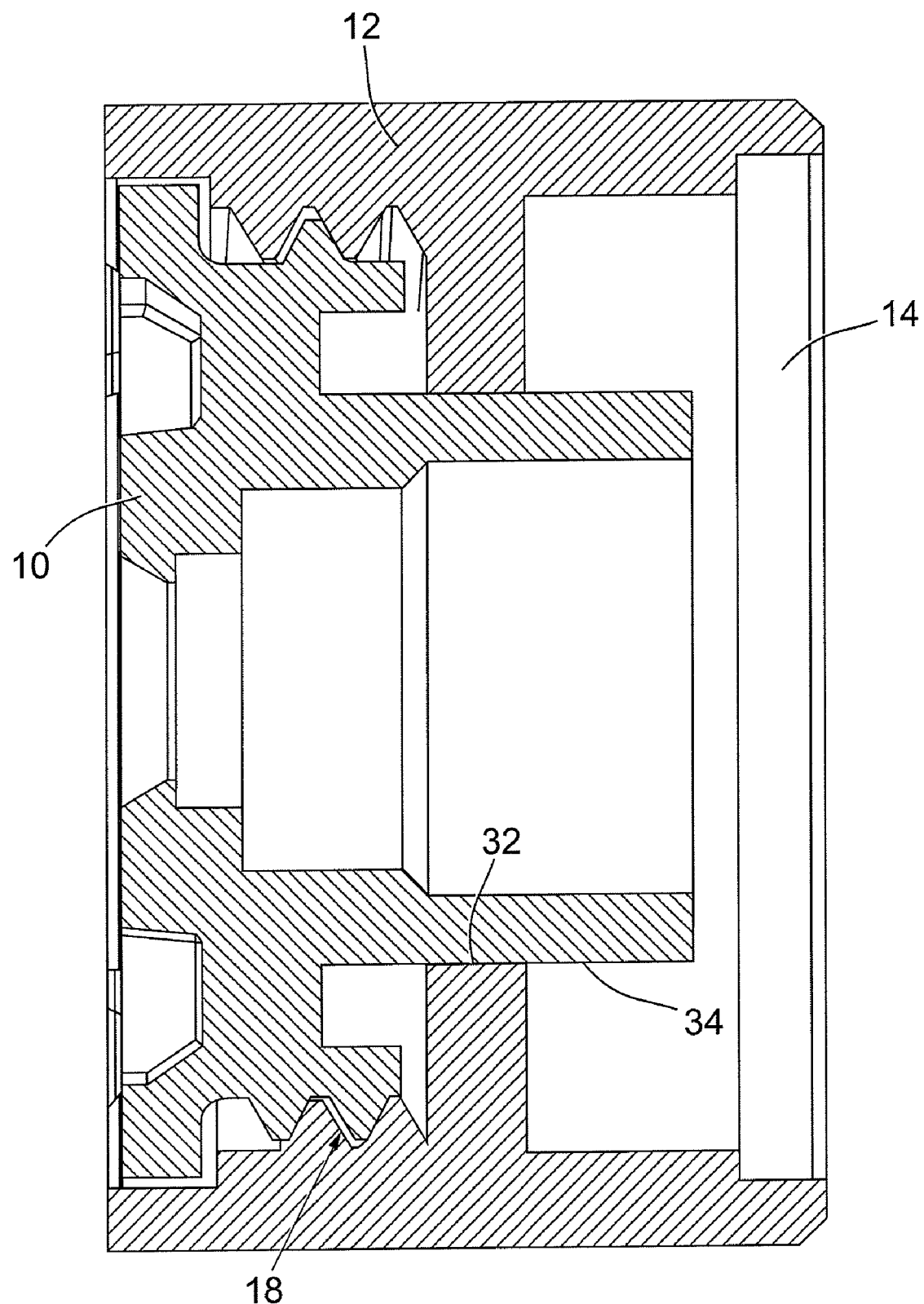
FIG. 4 illustrates a modified embodiment.

FIG. 4 illustrates a modified embodiment in which an inner surface 32 of the mount 12 is a close sliding fit against a cylindrical portion 34 of the lens barrel 10. This arrangement is less desirable, by increasing the overall length, but illustrates that there are a variety of ways of isolating potential debris produced by the focusing screw threads from the optical area.

The arrangement of FIGS. 1 to 3 is, however, preferred as the sliding contact may itself produce particles (although this is less likely than with the screw thread), and in FIGS. 1 to 3 such particles will be contained within the groove 26.

The assembly will typically be incorporated in a camera, which may itself form part of a mobile phone. The assembly may also be applied to an optical detector for an optical mouse.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A mounting assembly for positioning a lens or lens assembly relative to an image sensor chip, the mounting assembly comprising:
   a lens barrel adapted to hold a lens or lens assembly;
   a lens mount adapted to receive an image sensor chip;
   the lens barrel and the lens mount being provided with mating screw threads by which the lens or lens assembly may be moved along an optical axis to adjust focus on the image sensor chip; and
   wherein the lens barrel and lens mount are additionally provided with cooperating surfaces which engage in a sliding fit in a cylindrical surface around the optical axis, said cooperating surfaces being disposed between the optical axis and the screw threads; and
   wherein said cooperating surfaces are formed on a rib formed on one of the lens mount and the lens barrel and engaging in a groove formed in the other of the lens mount and the lens barrel.

2. The mounting assembly according to claim 1, wherein the rib is an annular, axially extending rib on the chip mount, and the groove is an annular, axially extending groove in the lens barrel.

3. The mounting assembly according to claim 2, wherein a radially outer cylindrical surface of the rib is a close sliding fit upon a radially outer cylindrical surface of the groove, and a clearance fit is defined between radially inner surfaces of the rib and groove.

4. The mounting assembly according to claim 1 wherein the assembly and image sensor chip form an imager for use in a camera.

5. The mounting assembly according to claim 1 wherein the assembly and image sensor chip form an imager for use in a mobile phone.

6. A mounting assembly for positioning a lens or lens assembly relative to an image sensor chip, the mounting assembly comprising:
   a lens barrel adapted to hold a lens or lens assembly;
   a lens mount adapted to receive an image sensor chip;
   the lens barrel and the lens mount being provided with mating screw threads by which the lens or lens assembly may be moved along an optical axis to adjust focus on the image sensor chip; and
   wherein the lens barrel and lens mount are additionally provided with cooperating surfaces which engage in a sliding fit in a cylindrical surface around the optical axis, said cooperating surfaces being disposed between the optical axis and the screw threads;
   wherein the assembly and image sensor chip form an imager for use in an optical mouse.

7. A lens mounting assembly, comprising:
   a lens barrel having outer radially extending circumferential threads and an axially extending circumferential groove;
   a mount having an opening for receiving the lens barrel, the opening having inner radially extending circumferential threads and an axially extending circumferential rib;
   wherein the axially extending circumferential groove in the lens barrel is sized and shaped to receive the axially extending circumferential rib from the mount; and
   wherein the axially extending circumferential groove has an inner radial surface and an outer radial surface, and wherein the axially extending circumferential rib has an inner radial surface and an outer radial surface.

8. The assembly of claim 7 wherein the outer radial surfaces of the axially extending circumferential groove and axially extending circumferential rib have a close sliding fit relationship to each other.

9. The assembly of claim 8 wherein the inner radial surfaces of the axially extending circumferential groove and axially extending circumferential rib have a clearance fit relationship to each other.

10. The assembly of claim 7 wherein the axially extending circumferential groove and the axially extending circumferential rib define an open region for trapping particles shed from mating of the circumferential threads of the lens barrel and mount.

11. A lens mounting assembly, comprising:
   a lens barrel having outer radially extending circumferential threads and an axially extending cylindrical rib;

a mount having an opening for receiving the lens barrel, the opening having inner radially extending circumferential threads and an inwardly radially extending circumferential rib;

wherein the inwardly radially extending circumferential rib of the mount defines a surface which abuts against an outer surface of the axially extending cylindrical rib;

wherein the surface of the inwardly radially extending circumferential rib which abuts against the outer surface of the axially extending cylindrical rib have a close sliding fit relationship to each other; and wherein the inner radial surfaces of the axially extending circumferential groove and axially extending circumferential rib have a clearance fit relationship to each other.

12. A lens mounting assembly comprising:

a lens barrel having outer radially extending circumferential threads and an axially extending cylindrical rib;

a mount having an opening for receiving the lens barrel, the opening having inner radially extending circumferential threads and an inwardly radially extending circumferential rib;

wherein the inwardly radially extending circumferential rib of the mount defines a surface which abuts against an outer surface of the axially extending cylindrical rib; and wherein the inner radial surfaces of the axially extending circumferential groove and axially extending circumferential rib have a clearance fit relationship to each other.

13. The assembly of claim 12 wherein the inwardly radially extending circumferential rib of the mount the axially extending cylindrical rib of the lens barrel define an open region for trapping particles shed from mating of the circumferential threads of the lens barrel and mount.

* * * * *